United States Patent
Welser et al.

(10) Patent No.: US 6,800,879 B2
(45) Date of Patent: Oct. 5, 2004

(54) METHOD OF PREPARING INDIUM PHOSPHIDE HETEROJUNCTION BIPOLAR TRANSISTORS

(75) Inventors: Roger E. Welser, Providence, RI (US); Paul M. Deluca, Providence, RI (US); Barbara E. Landini, North Attleboro, MA (US)

(73) Assignee: Kopin Corporation, Taunton, MA (US)

( * ) Notice: Subject to any disclaimer, the term of this patent is extended or adjusted under 35 U.S.C. 154(b) by 0 days.

(21) Appl. No.: 10/041,657

(22) Filed: Jan. 8, 2002

(65) Prior Publication Data

US 2002/0125498 A1 Sep. 12, 2002

Related U.S. Application Data

(60) Provisional application No. 60/260,236, filed on Jan. 8, 2001.

(51) Int. Cl.[7] .............................................. H01L 31/072
(52) U.S. Cl. ..................... 257/197; 257/191; 257/200; 257/201
(58) Field of Search ................. 257/197, 191, 257/200, 201

(56) References Cited

U.S. PATENT DOCUMENTS

| | | | | |
|---|---|---|---|---|
| 4,518,979 A | * | 5/1985 | Dumke et al. ............. | 257/462 |
| 5,371,389 A | * | 12/1994 | Matsuno et al. ........... | 257/197 |
| 5,429,957 A | * | 7/1995 | Matsuno et al. ........... | 438/312 |
| 5,571,732 A | * | 11/1996 | Liu .......................... | 438/312 |
| 5,606,185 A | | 2/1997 | Nguyen et al. ............ | 257/197 |
| 5,814,843 A | * | 9/1998 | Ohkubo ..................... | 257/197 |
| 5,858,818 A | | 1/1999 | Ro | |
| 5,903,018 A | * | 5/1999 | Shimawaki ................ | 257/198 |
| 6,031,256 A | | 2/2000 | Liu et al. .................. | 257/198 |
| 6,150,667 A | | 11/2000 | Ishizaka et al. | |
| 6,150,677 A | | 11/2000 | Tanaka et al. | |
| 6,285,044 B1 | | 9/2001 | Bhat ......................... | 257/197 |
| 2001/0040244 A1 | | 11/2001 | Fitzgerald et al. ......... | 257/191 |
| 2002/0027232 A1 | | 3/2002 | Shigematsu | |
| 2002/0102847 A1 | | 8/2002 | Sharps et al. | |

FOREIGN PATENT DOCUMENTS

| | | | |
|---|---|---|---|
| FR | 2 795 871 A1 | 1/2001 | |
| JP | 312685 | 11/1999 | ................. 21/331 |
| WO | WO 01/03194 A1 | 1/2001 | |
| WO | WO 02/43155 A2 | 5/2002 | |

OTHER PUBLICATIONS

Stockman, S.A., et al., "Carbon Doping of $In_xGa_{1-x}$ As By MOCVD Using $CCl_4$." In *Proceedings of the Fourth International Conference of InP and Related Materials* (Piscataway, NY:EIII) pp. 40–43 (1992).

Stillman, G.E., et al., "Carbon–doped InGaAs grown by MOCVD for InP/InGaAs heterojunction bipolar transistors." In *Gallium Arsenic and Related Compounds 1992: Proceedings of the Nineteenth International Symposium on Gallium Arsenide and Related Compounds*, T. Ikegami et al., eds. (Philadelphia: Inst. of Phys.), pp. 687–692 (1992).

(List continued on next page.)

*Primary Examiner*—Michael S. Lebentritt
*Assistant Examiner*—Douglas Menz
(74) *Attorney, Agent, or Firm*—Hamilton, Brook, Smith & Reynolds, P.C.

(57) ABSTRACT

InP heterojunction bipolar transistors having a base layer of InGaAs which are compositionally graded to engineer the bandgap of the base layer to be larger at the emitter/base junction than at the collector/base junction. The graded bandgap can increase DC current gain and speed of the device. A metalorganic chemical vapor deposition method of preparing InP heterojunction bipolar transistors having a base layer with a relatively high concentration of carbon dopant. The high carbon dopant concentration lowers the base sheet resistivity and turn-on voltage of the device.

5 Claims, 5 Drawing Sheets

OTHER PUBLICATIONS

Keiper, D. et al., "Metalorganic Vapour Phase Epitaxy Growth of InP–based Heterojunction Bipolar Transistors with Carbon Doped InGaAs Base Using Tertiarybutylarsine an Tertiarybutylphosphine in $N_2$ Ambient," *Jpn. J. Appl Phys.* 39 (Part 1, No.11):6162–6165 (2000).

Welser, R.E., et al., "Role of Neutral Base Recombination in High Gain AlGaAs/GaAs HBT's," *IEEE Transactions on Electron Devices,* 46(8):1599–1607 (1999).

Chang, P.C., et al., "InGaP/InGaAsN/GaAs NpN doubleheterojunction bipolar transistor," *Appl. Phys. Lett.,* 76(16):2262–2264 (2000).

Ahmari, D.A., et al., "High–speed InGaP/GaAs HBT's with a Strained $In_xGa_{1-x}As$ Base," *IEEE Electron Device Letters,* 17(5):226–228 (1996).

Welser, R.E., et al., "Turn–on Voltage Investigation of GaAs–Based Bipolar Transistors with $Ga_{1-x}In_xAs_{1-y}N_y$ Base Layers," *IEEE Electron Device Letters,* 21(12):1–4 (2000).

Low, T., et al., "InGaP HBT technology for RF and microwave instrumentation," *Solid–State Electronics,* 43:1437–1444 (1999).

Liu, W., et al., "Current Transport Mechanism in GaInP/GaAs Heterojunction Bipolar Transistors," *IEEE Transactions on Electron Devices,* 40(8):1378–1383 (1993).

Lu, Z.H., et al., "Determination of band gap narrowing and hole density for heavily C–doped GaAs by photoluminescence," *Appl. Phys. Lett.,* 64(1): 88–90 (1994).

Welser, R.E., et al., "High Performance $Al_{0.35}Ga_{0.65}As$/GaAs HBT's," *IEEE Electron Device Letters,* 21(5):196–199 (2000).

Welser, R.E., et al., "Base Current Investigation of the Long–Term Reliability of GaAs–Based HBTs," *GaAs Mantech,* (2000).

Patton, G.L., et al. "Graded–SiGe–Base, Poly–Emitter Heterojunction Bipolar Transistors," *IEEE Electron Device Letters,* 10(12):534–536 (1989).

Ida, M., et al., "InP/InGaAs DHBTs with 341–Ghz $f_T$ at high current density of over 800 $kA/cm^2$," *IEEE,* (2001).

Kroemer, H., "Heterostructure bipolar transistors: What should we build?" *J. Vac. Sci. Technol.,* B1(2):126–130 (1983).

Fujihara, A., et al., "High–speed InP/InGaAs DHBTs with Ballistic Collector Launcher Structure," *IEEE,* (2001).

Nakahara, K., et al., "Continuous–wave operation of long–wavelength GaInNAs/GaAs quantum well laser," *Electronic Letters,* 32(17): 1585–1586 (1996).

Mochizuki, K., et al., "GaInP/GaAs Collector–Up Tunneling–Collector Heterojunction Bipolar Transistors (C–Up TC–HBTs): Optimization of Fabrication Process and Epitaxial Layer Structure for High–Efficiency High–Power Amplifiers," *IEEE Transactions on Electron Devices,* 47(12):2277–2283 (2000).

Ohkubo, M., et al., "Compostionally Graded C–doped $In_{1-x}Ga_xAs$ Base in InP/InGaAs D–HBTs Grown by MOCVD with Low Base Sheet Resistance and High Current Gain", XP 10232064A, pp. 641–644., 1997.

Chang, P.C., et al., "InGaAsN/AIGaAs P–n–p heterojunction bipolar transistor", *Applied Physics Letters*, vol. 76, No. 19, pp. 2788–2790, May, 2000.

Welser, Roger E., et al., "Low $V_{be}$ GaInAsN Base Heterojunction Bipolar Transistors", *IEICE Trans. Electron.*, vol. E84–C, XP–008004890, No. 10, Oct., 2001, pp. 1389–1393.

Li, N.Y., et al., "DC characteristics of MOVPE–grown Npn InGaP/InGaAsN DHBTs", XP–000970554, *Electronics Letters* vol. 36, No. 1, Jan. 2000, pp. 81–83.

Yoshitaka, K., et al., "Using Carbon Tetrachloride for Carbon Doping A $1_xGa_{1-x}$ As Grown by Metalorganic Chemical Vapor Deposition", XP–002203037, *Jpn J. Appl. Phys.* vol. 34, Pt. 1, No. 7A, pp. 3504–3505, Jul. 1995.

Sugiua, H., "Characterization of heavily carbon–doped InGaAsP layers grown by chemical beam epitaxy using tetrabromide", XP–000788538, *Appl. Phys. Lett.*, vol. 73, No. 17, pp. 2482–2484, Oct. 1998.

Bhat, R., et al., "Growth of GaAsN/GaAs, GaInAsN/GaAs and GaInAsN/GaAs quantum wells by low–pressure organometallic chemical vapor deposition", *Journal of Crystal Growth* 195 (1998) pp. 427–437.

\* cited by examiner

METHOD OF PREPARING INDIUM PHOSPHIDE HETEROJUNCTION BIPOLAR TRANSISTORS

RELATED APPLICATION

This application claims the benefit of U.S. Provisional Application No. 60/260,236, filed on Jan. 8, 2001, the entire teachings of which are incorporated herein by reference.

BACKGROUND OF THE INVENTION

Bipolar junction transistors (BJT) and heterojunction bipolar transistor (HBT) integrated circuits (ICs) have developed into an important technology for a variety of applications, particularly as power amplifiers for wireless handsets, microwave instrumentation, and high speed (>10 Gbit/s) circuits for fiber optic communication systems. Future needs are expected to require devices with lower voltage operation, higher frequency performance, higher power added efficiency, and lower cost production.

Unlike BJTs in which the emitter, base and collector are fabricated from one semiconductor material, HBTs are fabricated from two or three dissimilar semiconductor materials in which the emitter semiconductor material has a wider band gap than the semiconductor material from which the base is fabricated. This results a superior injection efficiency of carriers from the base to collector over BJTs because there is a built-in barrier impeding carrier injection from the base back to the emitter. Selecting a base with a smaller band gap decreases the turn-on voltage because an increase in the injection efficiency of carriers from the base into the collector increases the collector current density at a given base-emitter voltage. However, in order to further increase the speed of the devices and further increase the collector current density at a given base-emitter voltage it would be desirable to minimize the transit time of carriers across the base into the collector.

InP-based heterojunction bipolar transistors (HBTs) are being developed for 40 Gbps lightwave circuits and wireless applications. Compared to GaAs-based HBTs, InP/InGaAs HBTs have lower turn-on voltage and a higher frequency of operation. The dominant growth technology in InP production has been molecular beam epitaxy (MBE), which typically employs either beryllium or carbon doping in the InGaAs base. Carbon-doped InP/InGaAs HBTs have demonstrated improved reliability in comparison with beryllium because carbon has a significantly lower diffusion rate in InGaAs. However, because MBE is not a multiwafer growth technique, it is impractical for large scale manufacture of wafers. Metalorganic chemical vapor deposition (MOCVD) can be used for multiwafer growth and therefore, is more suitable for large scale manufacture of HBTs. However, carbon-dopant levels in the base layer of HBTs fabricated using MOCVD have been relatively low. Thus, a more economical method of preparing InP-based HBT having a relatively high carbon dopant level in the base layer is necessary in order for InP-based HBTs to become reliable, cost-effective commercial circuits.

SUMMARY OF THE INVENTION

The present invention provides HBTs, and methods of fabricating HBTs, having a carbon-doped base layer composed of gallium, indium, and arsenic fabricated using MOCVD epitaxial growth system. The method involves growing a carbon-doped base layer represented by the formula $In_xGa_{1-x}As$ in which x is less than 1. In a preferred embodiment, x is about 0.4 to about 0.6. The base layer is grown from a gallium, indium, and arsenic source over an n-doped collector layer. Preferably, the collector is composed of InP or $In_{x'}Ga_{1-x'}As$ in which x' is less than 1. An n-doped emitter layer is then grown over the base layer. Preferably, the emitter is composed of InP grown from an indium and a phosphorous source or $In_yAl_{1-y}As$ in which y is less than 1 grown from an indium, aluminum and arsenic source.

In one embodiment, the base layer is doped with carbon, preferably at a concentration of about $1.5 \times 10^{19}$ cm$^{-3}$ to about $5.0 \times 10^{19}$ cm$^{-3}$. When the base layer is doped with carbon, the carbon is preferably incorporated in the base layer by growing the base layer in the presence of an external carbon source such as carbon tetrabromide or carbon tetrachloride.

In another embodiment, the composition of the base layer is graded so that the value of x is large at the surface of the base nearer to the collector than the surface of the base nearer the emitter. Preferably, the value of x is linearly graded across the base layer.

The method of the invention which utilizes MOCVD to fabricate InP-based HBTs is more cost effective than other methods of manufacturing InP-based HBTs. In addition, a base layer having a relatively high concentration of carbon dopant can be prepared using an external carbon source in the method of the invention. A high dopant concentration in the base layer is desirable because it decreases the base sheet resistivity ($R_{sb}$) of the base resulting in increased electron mobility across the base and increased collector current gain at a given emitter/base voltage. Thus, the development of carbon-doped InP/InGaAs HBTs grown by MOCVD will accelerate the insertion of InP HBTs into reliable, commercial circuits in a cost-effective manner.

Grading the composition of the base layers as disclosed in the method of the invention results in a graded band gap across the base layer in which the band gap is larger at the base-emitter interface and becomes gradually smaller at the base-collector interface. This introduces a quasielectric field which accelerates electrons across the base and thereby improving the speed of the device. In addition, increased transit of electrons across the base reduces hole-electron annihilation in the base and thus increases the current gain.

DETAILED DESCRIPTION OF THE INVENTION

Figure 1:
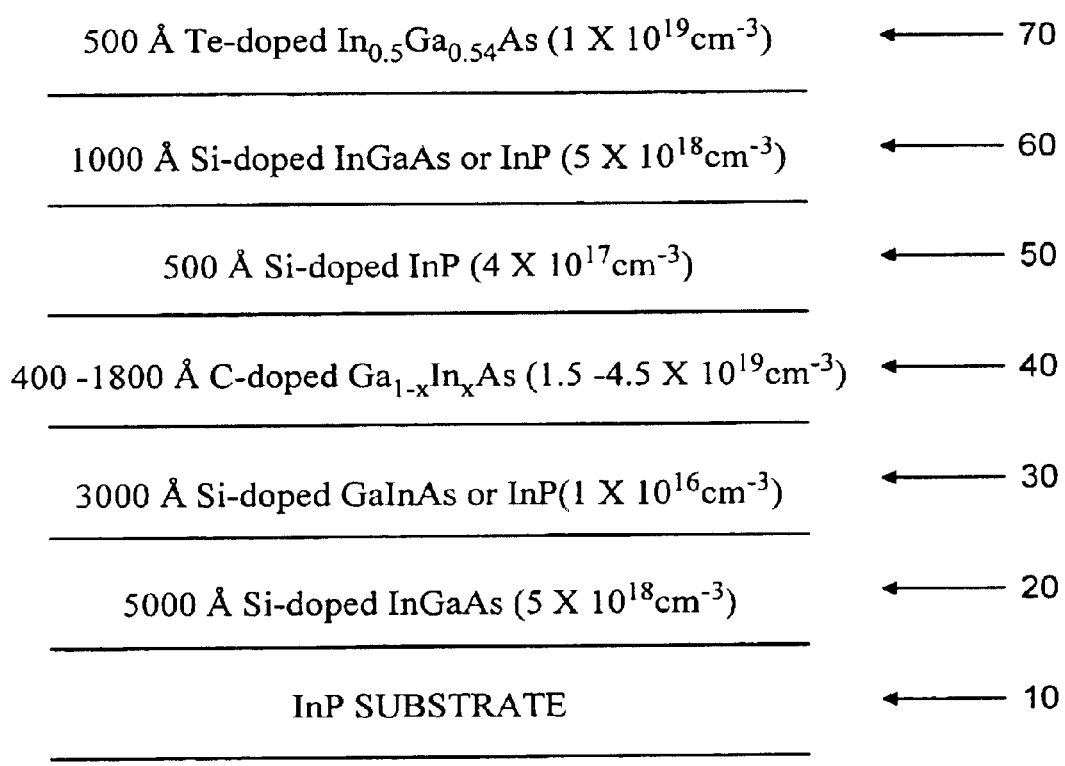
FIG. 1 illustrates InP/InGaAs SHBT and DHBT structures of a preferred embodiments of the invention.

The foregoing and other objects, features and advantages of the invention will be apparent from the following more particular description of preferred embodiments of the invention, as illustrated in the accompanying drawings.

In one embodiment, the present invention is an HBT having an n-doped collector, a carbon-doped base formed over the collector and composed of a III–V material that includes gallium, indium and arsenic, and an n-doped emitter formed over the base. The III–V material of the base layer has a carbon dopant concentration of about $1.5\times10^{19}$ cm$^{-3}$ to about $5.0\times10^{19}$ cm$^{-3}$.

In one embodiment, the transistor is a double heterojunction bipolar transistor (DHBT) having a base composed of a semiconductor material which is different from the semiconductor material from which the emitter and collector are fabricated. In a preferred embodiment of a DHBT, the base layer is $In_xGa_{1-x}As$, and the collector is InP, $In_{x'}Ga_{1-x'}As$, $In_yAl_{1-y}As$, $In_zGa_tAl_{1-z-t}As$ or $In_wGa_{1-w}As_uP_{1-u}$, and the emitter is selected from InP or $In_yAl_{1-y}As$ in which t, u, w, x', y, and z are each, independently, less than one. To avoid encumbering the text, ternary or quaternary compounds such as $In_xGa_{1-x}As$, $In_yAl_{1-y}As$, $In_zGa_tAl_{1-z-t}As$ or $In_wGa_{1-w}As_uP_{1-u}$ will be referred to herein as InGaAs, InAlAs, InGaAlAs and InGaAsP, respectively.

In a preferred embodiment, the base can be compositionally graded to produce a graded band gap layer having a narrow band gap at the collector and a wider band gap at the emitter. For example, a $In_xGa_{1-x}As$ base layer of a DHBT can be graded such that x is equal to 0.55 at the collector and is equal to about 0.45 at the emitter. The base layer can also be dopant-graded such that the dopant concentration is higher near the collector and decrease gradually across the thickness of the base to the base/emitter heterojunction. Linearly grading the dopant across the base layer is accomplished by linearly decreasing the dopant source as the base layer is grown. Methods of forming graded base layers are known to those skilled in the art and can be found on pages 303–328 of Ferry, et al., Gallium Arsenide Technology (1985), Howard W. Sams & Co., Inc. Indianapolis, Ind.

The present invention also provides a method of fabricating SHBTs and DHBTs. The method involves growing a base layer composed of gallium, indium, and arsenic over an n-doped InP, InGaAs, InAlAs, InGaAlAs or InGaAsP collector. The base layer is grown using an internal and external carbon source to provide carbon doped base layer. An n-doped emitter layer is then grown over the base layer. The use of an internal and external carbon source to provide the carbon dopant for the base layer results in a material with a relatively high carbon dopant concentration. Prior art HBTs having a carbon-doped InGaAs base layer prepared by MOCVD have a relatively low carbon dopant concentration because the carbon dopant is derived from decomposition of the indium, gallium and/or arsenic sources (i.e., from internal carbon sources). The method of the invention, employing an external carbon dopant source results in carbon dopant levels of about $1.5\times10^{19}$ cm$^{-3}$ to about $5.0\times10^{19}$ cm$^{-3}$. In a preferred embodiment, dopant levels of about $2.0\times10^{19}$ cm$^{-3}$ to about $5.0\times10^{19}$ cm$^{-3}$ are employed by the method of the invention. In addition, the incorporation of an in-situ annealing step within the growth process results in a higher effective base doping level. A higher dopant concentration in a material reduces the sheet resistivity and band gap of the material. Thus, the higher the dopant concentration in the base layer of an SHBT and a DHBT, the lower the turn on voltage of the device.

SHBTs and DHBTs of the invention can be prepared using an MOCVD epitaxial growth system. Preferred MOCVD epitaxial growth systems are Aixtron 2400 and Aixtron 2600 platforms. In the SHBTs and the DHBTs prepared by the method of the invention, typical an un-doped InP buffer layer is grown after in-situ oxide desorption. A subcollector layer containing a high concentration of an n-dopant (e.g., dopant concentration about $1\times10^{18}$ cm$^{-3}$ to about $2\times10^{19}$ cm$^{-3}$) is grown at a temperature of about 700° C. A collector layer with a low concentration of a n-dopant (e.g., dopant concentration about $5\times10^{15}$ cm$^{-3}$ to about $5\times10^{16}$ cm$^{-3}$) is grown over the subcollector at a temperature of about 700° C. Preferably, the subcollector and the collector are InP. Typically, the indium source used to grow the subcollector is trimethylindium (TMIn) or triethylindium (TEIn) and the phosphorous source is tributylphosphine (TBP). The subcollector layer typically has a thickness of about 4000 Å to about 6000 Å, and the collector typically has a thickness of about 1500 Å to about 5000 Å. In one embodiment, the dopant in the subcollector and/or the collector is silicon. Typically, the silicon dopant is introduced by using $Si_2H_6$ as a silicon source. Optionally, a lattice-match InGaAs layer can be used as the collector under typical growth conditions. $In_xGa_{1-x}As$ layers, in which x is about 0.53, are lattice matched to InP.

A carbon doped InGaAs base layer is grown over the collector. The base layer is grown at a temperature below about 650° C. and is typically about 400 Å to about 1500 Å thick. In a preferred embodiment, the base layer is grown at a temperature of about 450° C. to about 600° C. The base layer is grown using a gallium source, such as trimethylgallium or triethylgallium, an arsenic source, such as arsine, tributylarsine or trimethylarsine, and an indium source, such as trimethylindium. A low molar ratio of the arsenic source to the sum of the indium source and gallium source is preferred. Typically, the molar ratio of the arsenic source to the sum of the indium source and the gallium source is less than about 3.5. More preferably, the ratio is about 2.0 to about 3.0. An InGaAs layer having a low concentration of carbon dopant (e.g., $5.0\times10^{18}$ cm$^{-3}$ or lower) can be achieved without the use of an external carbon source presumably because carbon is derived internally from the gallium, indium and/or arsenic source. In the present invention, an InGaAs layer having a high carbon dopant concentration of about $1.5\times10^{19}$ cm$^{-3}$ to about $5.0\times10^{19}$ cm$^{-3}$ is achieved by using an external carbon source in addition to the gallium, indium and arsenic source. The external carbon source used was carbon tetrabromide. Carbon tetrachloride is also an effective external carbon source.

In one embodiment, the composition of the $In_xGa_{1-x}As$ base layer of an SHBT or DHBT is graded from a lower value of x at the emitter/base interface to a higher value of x at the collector/base interface. This produces a base having a higher band gap at the emitter/base interface than at the collector/base interface. In a preferred embodiment, the composition of the base is linearly graded by varying the ratio of the indium and gallium sources entering the growth chamber. Typically, when growing the base layer over the collector, the ratio of the indium source to the gallium source is larger at the start of the growth process and is decreased linearly as the base layer is grown. In a preferred embodiment, x is about 0.4 at the emitter/base interface and is increased to about 0.6 at the collector/base interface. More preferably, x is 0.5 at the emitter/base interface and is increased to about 0.56 at the collector/base interface. With no grading of the base, minor carriers (electrons in an npn HBT) are transported by diffusion across the base into the collector. When the base is graded to produce a higher band gap at the emitter/base interface than at the collector/base interface, a quasielectric field is established in the npn HBT that accelerates electrons through the base into the collector. This quasielectric field reduces the electron transport time across the base, increasing the DC current gain (β) in the HBT and the speed of the device.

In another embodiment, the base layer is annealed in-situ by stopping the flow of the growth gases and dopant gas when an external dopant source is used (e.g., the indium source, the gallium source, the arsenic source and the carbon source) while maintaining the flow of the carrier gas and holding the base layer at a temperature for a period of time. Preferably, the temperature for the in-situ annealing process is about 450° C. to about 650° C. and the base layer is annealed for about 5 minutes to about 30 minutes. It is believed that in-situ annealing activates p-type carriers in the base layer by driving off hydrogen. During the growth process, the organometal compounds decompose to produce atomic hydrogen atoms which can bind to p-type dopants such as carbon and prevent them from acting as acceptors. Thus, passivation of p-dopants in the base increases the sheet resistivity resulting in an HBT having a higher turn-on voltage. However, during in-situ annealing of the base layer, the bond between hydrogen and p-dopants are broken and hydrogen is released. Thus, the number of dopant atoms which can act as acceptors is increased, causing the base sheet resistivity and turn-on voltage to decrease.

The emitter layer of either InP or InAlAs is grown over the base. In a preferred embodiment, the emitter layer is InP. The emitter layer is n-doped at a concentration of about $1.0 \times 10^{17}$ cm$^{-3}$ to about $9.0 \times 10^{17}$ cm$^{-3}$ and, typically, has a thickness of about 400 Å to about 1500 Å. When the emitter is InP, the layer is grown using an indium source such as TMIn or TEIn and a phosphorous source such as tributylphosphine (TBP). When the emitter layer is InAlAs, the layer was grown using an indium source such as TMIn or TEIn, a gallium source such as trimethylgallium or triethylgallium, and an aluminum source such as trimethylaluminum. An emitter contact layer composed of InP containing a high concentration of an n-dopant (e.g., about $1.0 \times 10^{18}$ cm$^{-3}$ to about $2 \times 10^{19}$ cm$^{-3}$) is grown over the emitter. Typically, the emitter contact layer is about 500 Å to about 2000 Å thick. A InGaAs layer with a high concentration of an n-dopant (e.g., about $5 \times 10^{18}$ cm$^{-3}$ to about $5 \times 10^{19}$ cm$^{-3}$) is grown over the emitter contact layer. This layer is about 400 Å to about 1000 Å thick.

EXAMPLES

A. Preparation of SHBTs and DHBTs

All of the InP devices used in the following discussion have MOCVD-grown, carbon-doped base layers in which the dopant concentration varied from about $1.5 \times 10^{19}$ cm$^{-3}$ to about $5.0 \times 10^{19}$ cm$^{-3}$ and a thickness varied from about 300 Å to about 1500 Å, resulting in a base sheet resistivity ($R_{sb}$) of between 500 Ω/square and 1500 Ω/square. Large area devices (L=75 μm×75 μm) were fabricated using a simple wet-etching process and tested in the common base configuration. The InP/InGaAs SHBT and DHBT structure used in this discussion are illustrated in FIG. 1. The base layer (40) in the SHBTs and DHBTs prepared by the following method was composed of InGaAs and the emitter layer (50) was composed of InP. The SHBTs had a collector layer (30) of InGaAs, whereas DHBTs had a collector layer (30) of InP.

All growth occur with a reactor pressure of 200 mbar. Oxide was removed by maintaining the growth chamber for approximately 5 minutes at 650° C. with a phosphorous source (either PH$_3$ or TBP) flowing into the reactor. An rip buffer layer was grown at a rate of 2 Å/sec using TMIn and tributylphosphine as source gases and a growth temperature of 600° C. Typical buffer thickness was 500 Å. An InP subcollector was grown at a rate of 2 Å/sec using TMIn and tributylphosphine as source gases and a growth temperature of 600° C. The subcollector had a thickness of 4000 Å–7000 Å (preferably 5000 Å) and a silicon doping level of $1 \times 10^{19}$ cm$^{-3}$ which was introduced using a Si$_2$H$_6$ as a silicon source. An InGaAs etch stop/contact layer was prepared using TMIn, TMGa, and AsH$_3$ as source gases with a growth rate of 3 Å/sec. The In and Ga ratio was such that the layer was lattice matched to InP and the layer had a thickness of 500 Å. The growth temperature was 600° C.

Figure 2:
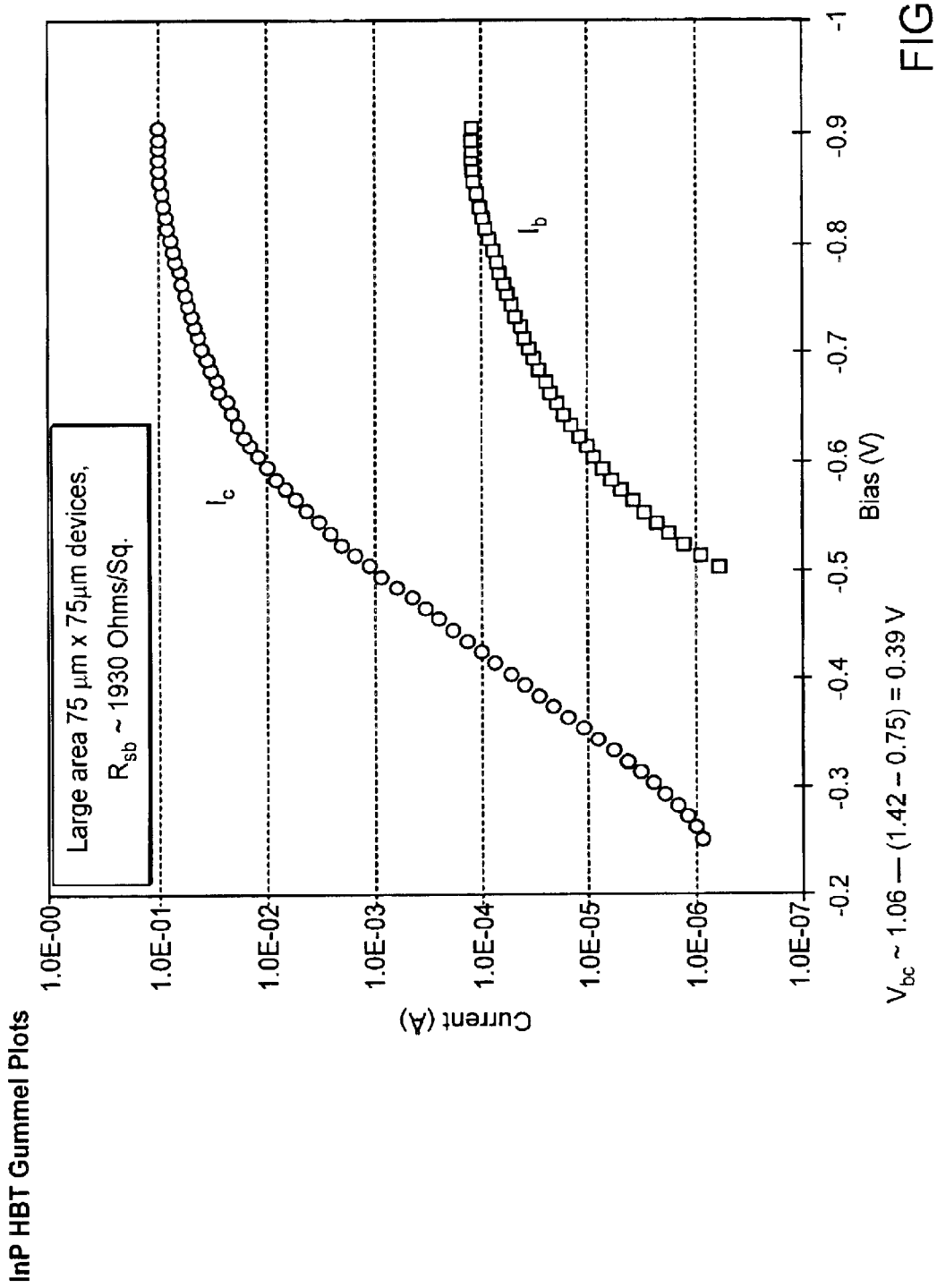
FIG. 2 is a Gummel plot which graphical illustrates the base and collector currents as a function of turn on voltage for an InP/InGaAs SHBT.

The SHBT used to obtain the data of FIG. 2 had a InGaAs collector layer which was prepared using TMIn, TMGa, and AsH$_3$ as source gases with a growth rate of 3 Å/sec. The growth temperature was 600° C. The collector layer had a thickness of 2000 Å to about 5000 Å.

The DHBTs used to obtain the data of FIGS. 3–6 had an Inp collector layer. The InP collector was grown at a rate of 2 Å/sec using TMIn and tributylphosphine as source gases and a growth temperature of 600° C. The collector had a thickness of about 2000 Å to about 5000 Å and a silicon doping level of $1 \times 10^{16}$ cm$^{-3}$ to $5 \times 10^{16}$ cm$^{-3}$.

Figure 3:
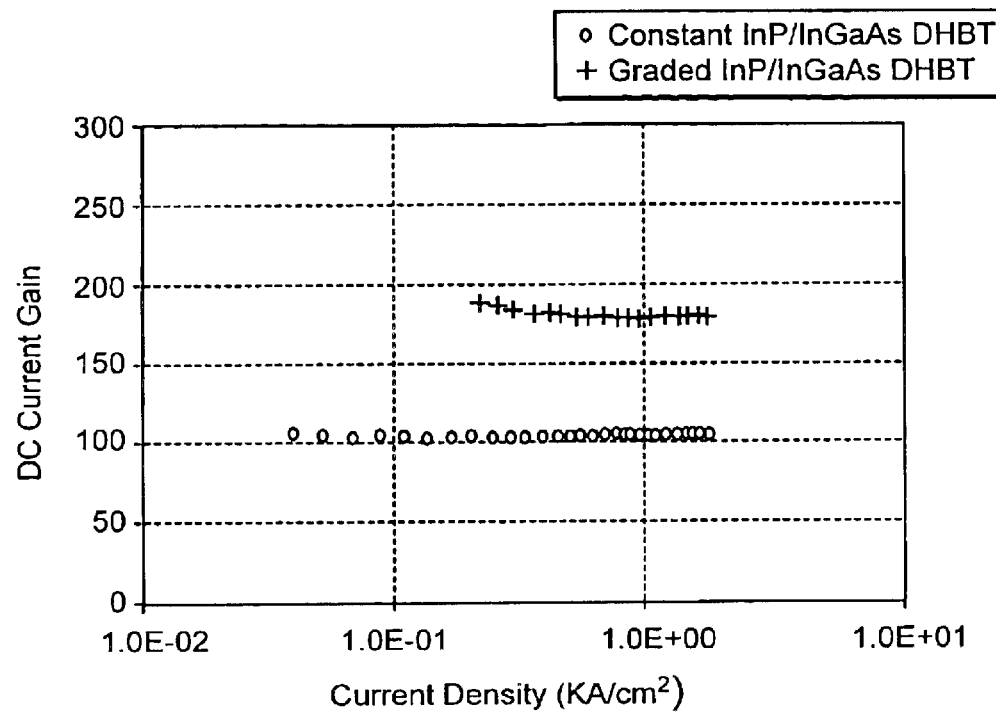
FIG. 3 is a gain versus collector current density plot for InP/InGaAs DHBT structures with and without a graded base.
Figure 4:
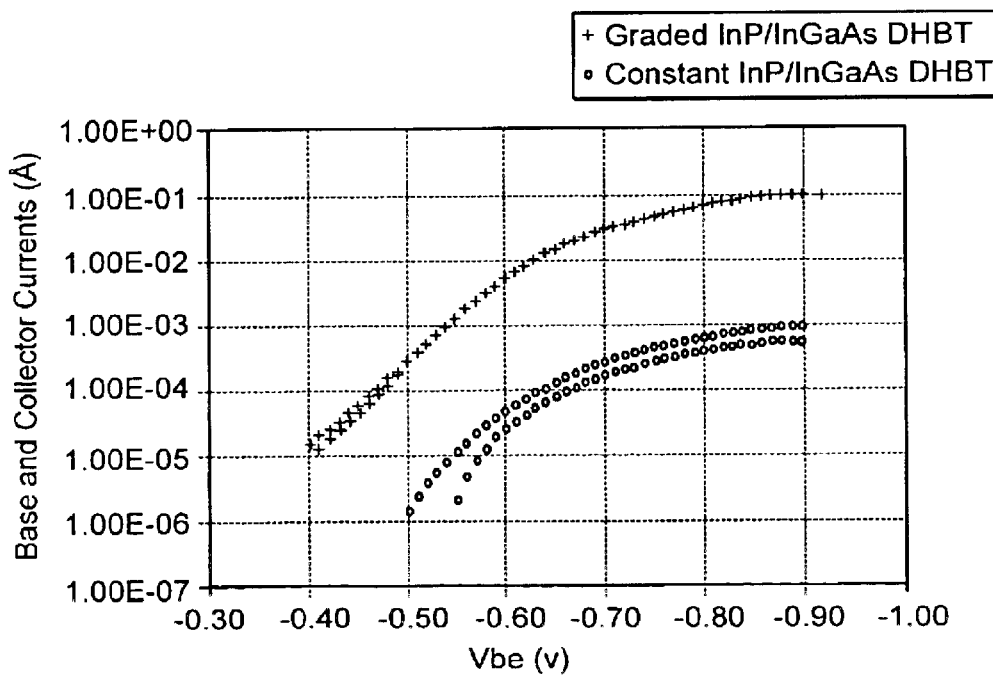
FIG. 4 is a Gummel plot which illustrates the base and collector current for InP/InGaAs structures with and without a graded base.

The DHBTs used to obtain the data presented in FIGS. 3 and 4 has a graded In$_x$Ga$_{1-x}$As base layer. An InGaAs base layer was grown at a temperature of 550° C. using TMIn, TMGa, and TMAs as source gases and CBr$_4$ as an external dopant. The flow ratio of the TMIn to CBr$_4$ was approximately 1 to obtain a dopant level of $3 \times 10^{19}$ cm$^{-3}$. The flow ratio of TMAs to the sum of the TMGa plus TMIn was 2. In order to produce a base layer which was linearly graded from a composition in which x is 0.55 at the collector to a composition in which x is 0.45 at the emitter, the flow ratio of TMIn to TMGa was 16 to 1 at the beginning of growth (i.e., at the collector) and was linearly varied to a ratio of 14 to 1 at the end of growth. The growth rate was 1.5 Å/sec and the thickness of the base was 400 to 1000 Å.

Figure 5:
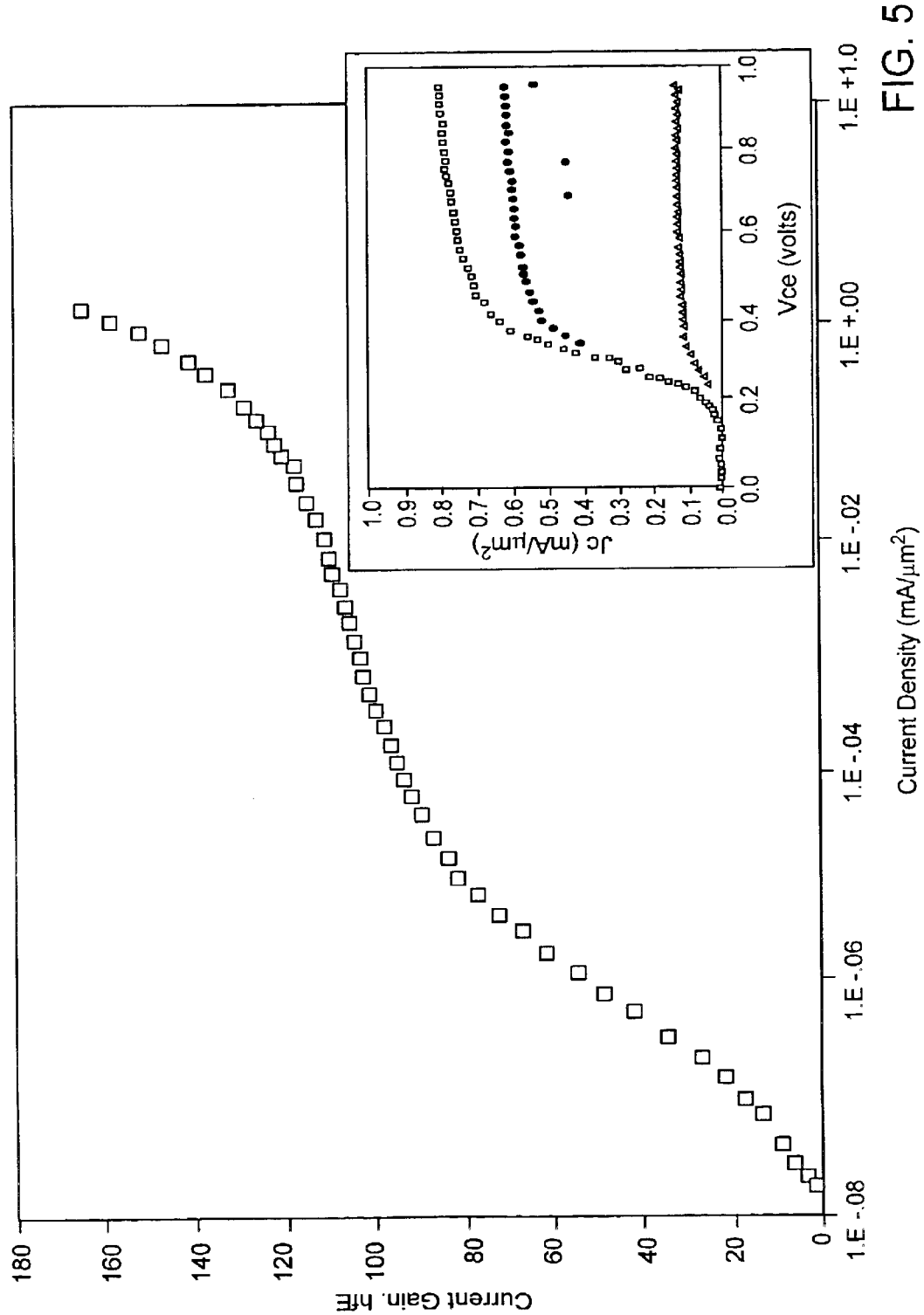
FIG. 5 is a gain vs. collector current density plot for small area devices. The insert shows the common emitter characteristics for the same small area device.
Figure 6:
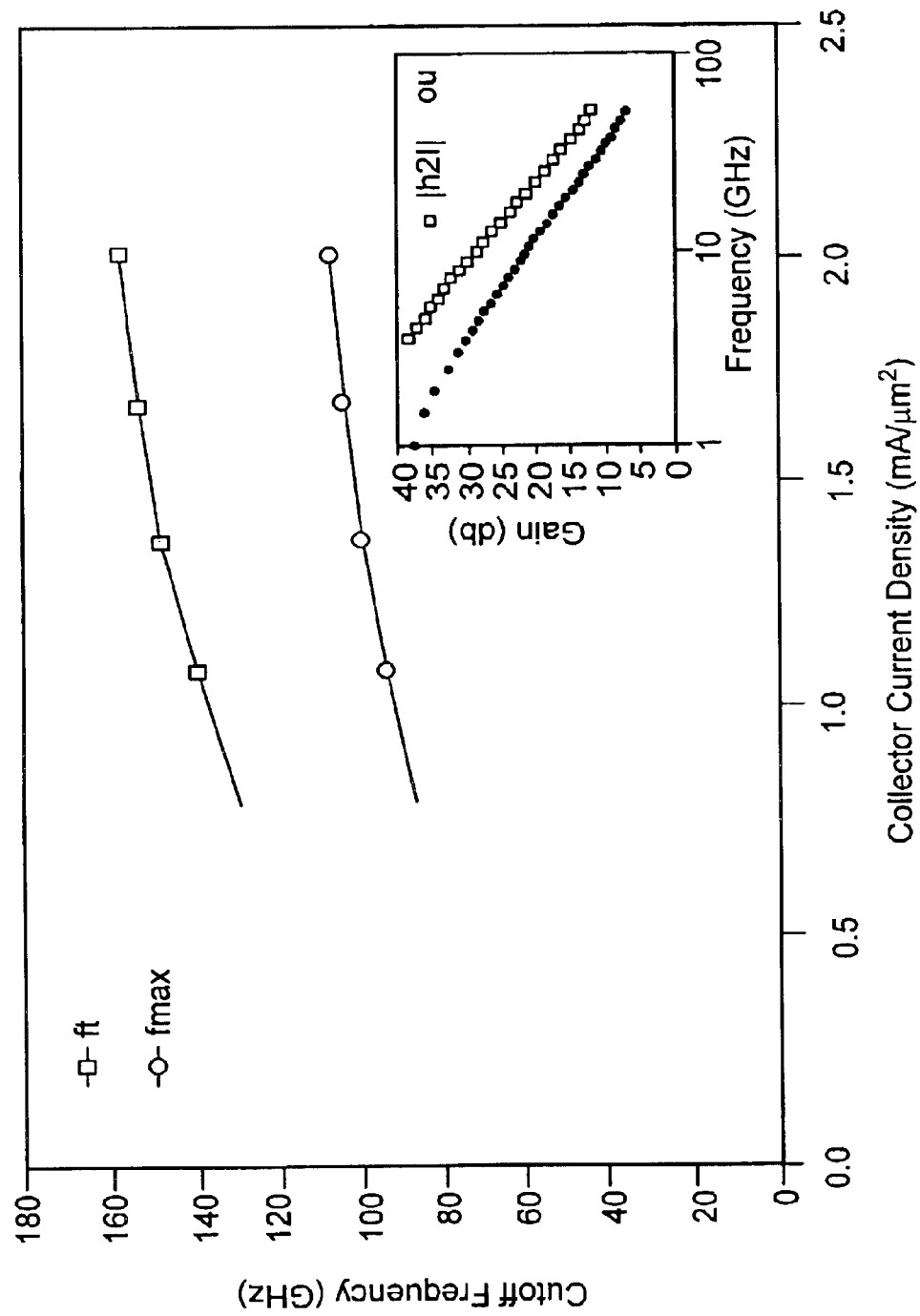
FIG. 6 shows the frequency vs. collector current density for the small area device in FIG. 5. The insert shows the RF current gain vs. RF frequency.

The DHBTs used to obtain the data presented in FIGS. 5 and 6 and the SHBT used to obtain the data of FIG. 2 had a base layer with a composition of IN$_{0.55}$Ga$_{0.45}$As. An InGaAs base layer was grown at a temperature of 550° C. using TMIn, TMGa, and TMAs as source gases and CBr$_4$ as an external dopant. The flow ratio of the TMIn to CBr$_4$ was approximately 1 to obtain a dopant level of $3 \times 10^{19}$ cm$^{-3}$. The flow ratio of TMAs to the sum of the TMGa plus TMIn was 2. The flow ratio of TMIn to TMGa of 16 to 1 gave a base layer having a composition of In$_{0.55}$Ga$_{0.45}$As. The growth rate was 1.5 Å/sec and the thickness of the base was 400 to 1000 Å.

An InP emitter was grown at a rate of 2 Å/sec using TMIn and tributylphosphine as source gases and a growth temperature of 600° C. Emitter had a thickness of 400 Å–800 Å (preferably 500 Å) and a silicon doping level of $3 \times 10^{17}$ cm$^{-3}$ to about $6 \times 10^{17}$ cm$^{-3}$ which was introduced using a Si$_2$H$_6$ as a silicon source.

An InP emitter cap was grown at a rate of 2 Å/sec using TMIn and tributylphosphine as source gases and a growth temperature of 600° C. Emitter cap had a thickness of 500 Å–1500 Å (preferably 1000 Å) and a silicon doping level of $5 \times 10^{18}$ cm$^{-3}$ to about $1 \times 10^{19}$ cm$^{-3}$ which was introduced using a Si$_2$H$_6$ as a silicon source. An InGaAs contact layer having a thickness of 500 Å to 1500 Å (preferably 1000 Å) and a tellurium doping level of $1 \times 10^{19}$ cm$^{-3}$ to $2 \times 10^{19}$ cm$^{-3}$ was grown over the emitter cap layer. Diisopropyl tellurium was used as the dopant source.

B. Results and Discussion

FIG. 2 shows the Gummel plots and common emitter characteristics of a typical SHBT small area device (2×4 µm$^2$) with a 3000 Å collector and a 600 Å base having a sheet resistivity R$_{sb}$=1930 ohms/sq (Na≈2×10$^{19}$ cm$^{-3}$). The Gummel plots of the collector current and base current are nearly ideal with no observed base leakage. The SHBT structure begins to breakdown under modest bias conditions, as expected. The RF properties of a similar SHBT structure with a 2000 Å collector were measured on a 1×10 µm$^2$ device. The current gain cutoff frequency, f$_t$, and the power gain cutoff frequency, f$_{max}$, were measured at greater than 150 GHz and 110 GHz, respectively, at a current density of 2×10$^5$ Å/cm$^2$.

Grading the InGaAs base composition afforded an additional means of controlling the electron velocity in an InP DHBT base. In the DHBTs used to produce the results shown in FIGS. 3 and 4, the emitter and collector were composed of InP and the In$_x$Ga$_{1-x}$As base layer was compositionally graded from a low value of x≈0.5 (i.e., high bandgap) at the emitter to a higher x value of x≈0.56 (i.e., low bandgap) at the collector. This bandgap engineering established a quasielectric field in the npn DHBTs which caused electrons to accelerate in the base. This field reduced electron transport time across the base, thereby reducing electron/hole recombination in the base and increasing the DC current gain (β) in DHBTs. FIG. 3 compares the gain of a DHBT having a graded base layer to the gain of a DHBT having a non-graded base layer. The devices were otherwise identical in structure with similar base sheet resistance (R$_{sb}$) values of approximately 1000 Ω/square in 75×75 µm$^2$ devices. The gain of the DHBT having a graded base layer was approximately 1.6 times that of the DHBT having a non-graded base layer. The Gummel plots for these two devices (FIG. 4) showed that the increased gain of the graded base DHBT was caused by a reduction in n=1 (neutral base recombination) base current. The reduced n=1 base current is due to the field-induced increase in the electron velocity in the base.

The RF characteristics of small area DHBTs having a collector and emitter of InP and a base layer of In$_x$Ga$_{1-x}$As were analyzed in FIGS. 5 and 6. Baseline small-area InP DHBTs showed no gain compression at high current density (J$_c$) and the common—emitter characteristics displayed minimal conduction band spiking at the base-collector interface, as seen by the low knee and offset voltage and low output conductance (FIG. 5). Low knee voltage indicates that the barrier to carriers at the base/collector junction is low reducing the minimum saturation voltage needed to produce an operating current for the device. The RF characteristics (FIG. 6) showed no frequency reduction out to a 2×10$^5$ Å/cm$^2$ collector current density.

While this invention has been particularly shown and described with references to preferred embodiments thereof, it will be understood by those skilled in the art that various changes in form and details may be made therein without departing from the scope of the invention encompassed by the appended claims.

What is claimed is:

1. A double heterojunction bipolar transistor, comprising:
   a) an n-doped emitter composed of a material selected from InP or In$_y$Al$_{1-y}$As, wherein y is less than 1;
   b) an n-doped collector composed of a material selected from InP, In$_y$Al$_{1-y}$As, In$_z$Ga$_t$Al$_{1-z-t}$As or In$_w$Ga$_{1-w}$As$_u$P$_{1-u}$, wherein t, u, w, and z are each, independently, less than 1; and
   c) a compositionally graded p-doped base layer having a first surface which forms a first heterojunction with the emitter and a second surface which forms a second heterojunction with the collector and composed of a material represented by the formula In$_x$Ga$_{1-x}$As, wherein x is less than 1 and wherein x is larger at the second surface than at the first surface.

2. The transistor of claim 1, wherein the compositional grade of the base is linear.

3. The transistor of claim 2, wherein x is graded from about 0.56 to about 0.5.

4. The transistor of claim 3, wherein the emitter and the collector are InP.

5. The transistor of claim 2, wherein the base is doped with carbon at a concentration of about 1.5×10$^{19}$ cm$^{-3}$ to about 5.0×10$^{19}$ cm$^{-3}$.

* * * * *